US 12,419,110 B2

(12) United States Patent
Chen (10) Patent No.: US 12,419,110 B2
(45) Date of Patent: Sep. 16, 2025

(54) ARRAY SUBSTRATE, DISPLAY PANEL, AND ALIGNMENT METHOD OF LIQUID CRYSTAL MOLECULES

(71) Applicant: Shenzhen China Star Optoelectronics Semiconductor Display Technology Co., Ltd., Guangdong (CN)

(72) Inventor: Yani Chen, Guangdong (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 0 days.

(21) Appl. No.: 18/398,444

(22) Filed: Dec. 28, 2023

(65) Prior Publication Data

US 2025/0107231 A1 Mar. 27, 2025

(30) Foreign Application Priority Data

Sep. 26, 2023 (CN) .......................... 202311267552.4

(51) Int. Cl.
- *H10D 86/60* (2025.01)
- *G02F 1/1362* (2006.01)
- *H10D 86/40* (2025.01)

(52) U.S. Cl.
CPC ....... *H10D 86/60* (2025.01); *G02F 1/136286* (2013.01); *H10D 86/443* (2025.01)

(58) Field of Classification Search
CPC .......... H01L 27/1244; G02F 1/136286; G02F 1/136218; G02F 1/136213; G02F 1/134318; G02F 1/134309; H10D 86/60
See application file for complete search history.

(56) References Cited

U.S. PATENT DOCUMENTS

| 8,368,630 B2 | 2/2013 | Lee et al. |
| 2006/0145990 A1* | 7/2006 | Kim ................. G02F 1/136227 345/94 |

(Continued)

FOREIGN PATENT DOCUMENTS

KR 10-2010-0048264 5/2010

OTHER PUBLICATIONS

Notice of Reasons for Rejection Dated Jan. 26, 2025 From the Korean Intellectual Property Office Re. Application No. 10-2023-0178222 and its Translation Into English. (14 Pages).

*Primary Examiner* — Michael H Caley
*Assistant Examiner* — David Y Chung (57) ABSTRACT

An array substrate includes a first substrate, data lines, a pixel electrode layer, first transparent common electrode lines, and second transparent common electrode lines disposed on the first substrate. The data lines extend in a first direction and are arranged at intervals in a second direction intersecting the first direction. The pixel electrode layer includes a plurality of pixel electrodes. Both the first transparent common electrode lines and the second transparent common electrode lines extend in the first direction and are disposed insulated from the pixel electrode layer, and the second transparent common electrode lines are disposed disconnected from the first transparent common electrode lines. An orthographic projection of a gap between a first and a second transparent common electrode line adjacent to each other in the second direction on the first substrate overlaps with an orthographic projection of at least one pixel electrode on the first substrate.

20 Claims, 6 Drawing Sheets

(56) References Cited

U.S. PATENT DOCUMENTS

| | | | |
|---|---|---|---|
| 2008/0239215 A1* | 10/2008 | Chae | G09G 3/3648 349/107 |
| 2017/0235200 A1* | 8/2017 | Chong | G02F 1/1362 257/59 |
| 2022/0283470 A1* | 9/2022 | Cheng | G02F 1/136218 |

* cited by examiner

ARRAY SUBSTRATE, DISPLAY PANEL, AND ALIGNMENT METHOD OF LIQUID CRYSTAL MOLECULES

CROSS-REFERENCE TO RELATED APPLICATION

This application claims the benefit of priority of Chinese Patent Application No. 202311267552.4, filed on Sep. 26, 2023, the contents of which are incorporated by reference as if fully set forth herein in their entirety.

TECHNICAL FIELD

The present disclosure relates to the field of display technologies, and more particularly, to an array substrate, a display panel, and an alignment method of liquid crystal molecules.

BACKGROUND

In recent years, the liquid crystal display (LCD) industry has developed rapidly, and great breakthroughs have been made in key technologies such as large size, curved surface, and ultra-high resolution. Although new display technologies, such as miniature light-emitting diodes (Mini LEDs), organic light emitting diode (OLEDs), and quantum-dot light emitting diodes (QLEDs), have begun to appear in the market, they have been slowly developed due to the dual limitations of raw materials and precision of equipment. Thus, in the coming years, LCD still occupies an absolute dominant position in the display industry due to mature technology, complete material system, and low cost. The improvement of transmittance is one of the effective ways for LCD to achieve "low power consumption".

Therefore, how to improve the transmittance of LCD is a technical problem to be solved.

SUMMARY

In a first aspect, the present disclosure provides an array substrate including:
a first substrate;
a plurality of data lines extending in a first direction and arranged at intervals in a second direction, disposed on the first substrate, the first direction intersecting the second direction;
a pixel electrode layer disposed on the first substrate and including a plurality of pixel electrodes;
first transparent common electrode lines extending in the first direction, disposed on the first substrate and insulated from the pixel electrode layer; and
second transparent common electrode lines extending in the first direction, disposed on the first substrate and insulated from the pixel electrode layer, and disposed disconnected from the first transparent common electrode lines;
where an orthographic projection of a gap between one of the first transparent common electrode lines and one of the second transparent common electrode lines adjacent to each other in the second direction on the first substrate overlaps with an orthographic projection of at least one of the pixel electrodes on the first substrate.

In a second aspect, the present disclosure provides a display panel including an array substrate, an opposing substrate, and a liquid crystal layer, the opposing substrate is disposed opposite to the array substrate, and the liquid crystal layer is disposed between the array substrate and the opposing substrate;
the array substrate includes:
a first substrate;
a plurality of data lines extending in a first direction and arranged at intervals in a second direction, disposed on the first substrate, the first direction intersecting the second direction;
a pixel electrode layer disposed on the first substrate and including a plurality of pixel electrodes;
first transparent common electrode lines extending in the first direction, disposed on the first substrate and insulated from the pixel electrode layer; and
second transparent common electrode lines extending in the first direction, disposed on the first substrate and insulated from the pixel electrode layer, and disposed disconnected from the first transparent common electrode lines;
where an orthographic projection of a gap between one of the first transparent common electrode lines and one of the second transparent common electrode lines adjacent to each other in the second direction on the first substrate overlaps with an orthographic projection of at least one of the pixel electrodes on the first substrate.

In a third aspect, the present disclosure provides an alignment method of liquid crystal molecules, applied to a display panel, where the display panel includes an array substrate and an opposing substrate disposed opposite each other, and a liquid crystal layer disposed between the array substrate and the opposing substrate and including a plurality of liquid crystal molecules; the array substrate includes a first substrate and a pixel electrode layer disposed on the first substrate, first transparent common electrode lines extending in a first direction, second transparent common electrode lines extending in the first direction, and a plurality of data lines extending in a first direction and arranged at intervals in a second direction; the pixel electrode layer including a plurality of pixel electrodes, the first transparent common electrode lines and the second transparent common electrode lines disposed disconnected from each other and insulated from the pixel electrode layer; an orthographic projection of a gap between one of the first transparent common electrode lines and one of the second transparent common electrode lines adjacent to each other in the second direction on the first substrate overlaps with an orthographic projection of at least one of the pixel electrodes on the first substrate, the first direction intersecting the second direction;
the method including:
applying a first preset alignment voltage to the first transparent common electrode lines;
applying a second preset alignment voltage to the second transparent common electrode lines, the second preset alignment voltage being different from the first preset alignment voltage.

DETAILED DESCRIPTION

The technical solutions in the embodiments of the present disclosure will be clearly and completely described below with reference to the accompanying drawings in the embodiments of the present disclosure. Obviously, the described embodiments are only some of the embodiments of the present disclosure, but not all of the embodiments. Based on the embodiments in the present disclosure, all other embodiments obtained by those skilled in the art without making creative efforts fall within the scope of protection of the present disclosure.

Figure 1:
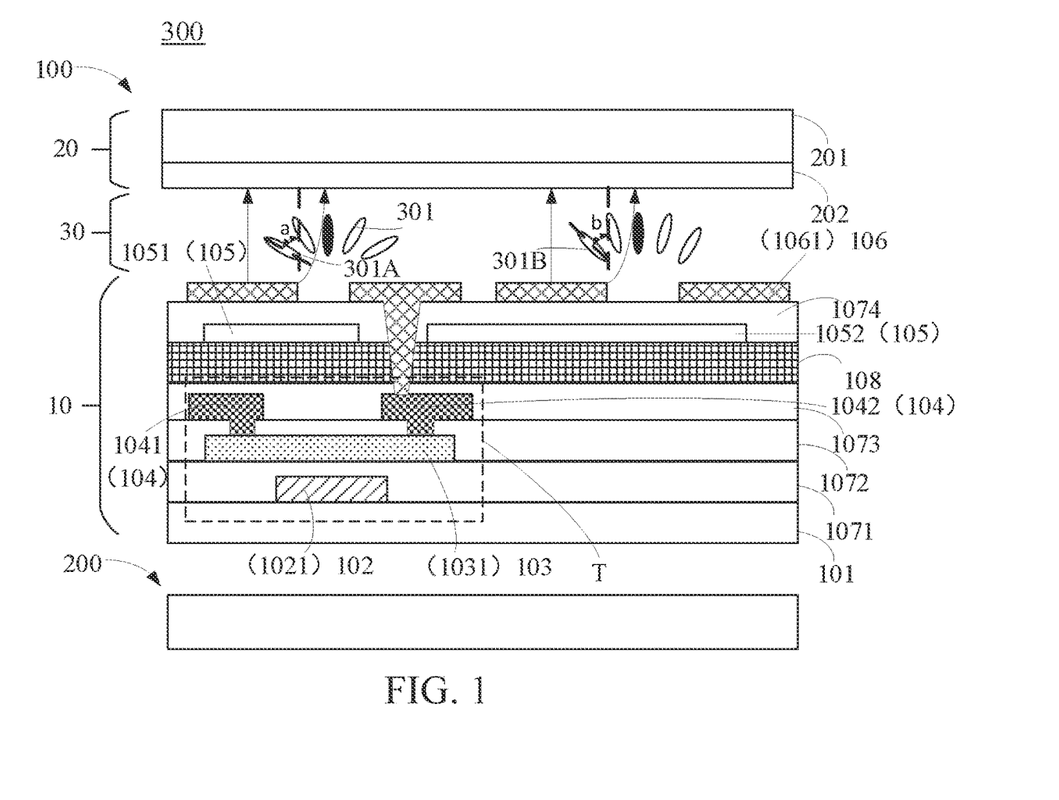
FIG. 1 is a schematic cross-sectional view of a display device according to some embodiments of the present disclosure.
Figure 2:
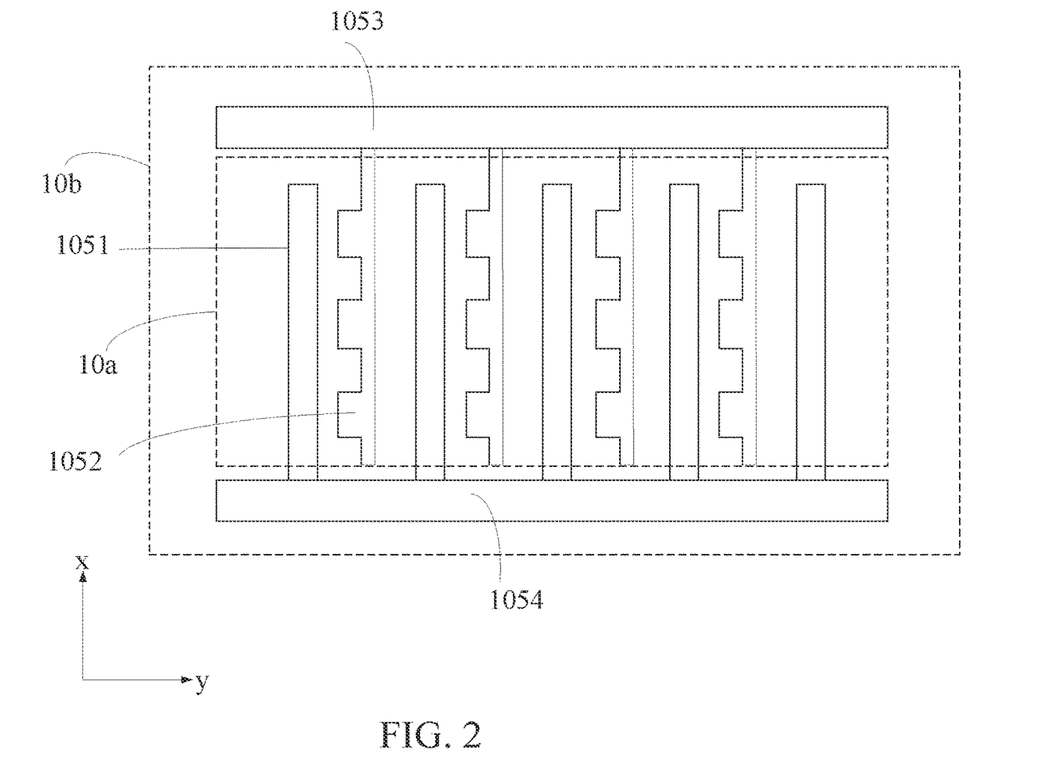
FIG. 2 is a schematic plan view of a transparent conductive layer according to some embodiments of the present disclosure.
Figure 3:
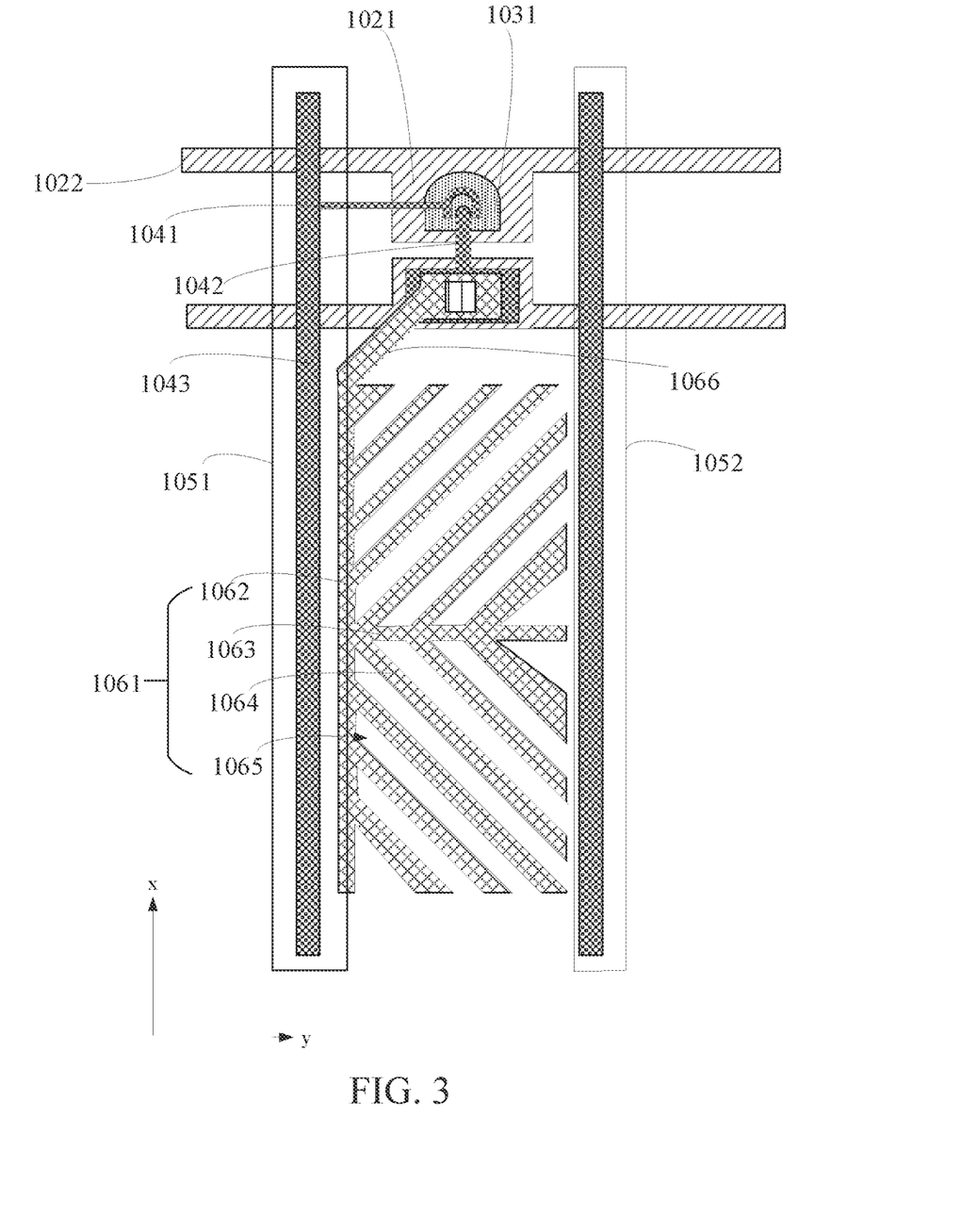
FIG. 3 is a schematic plan view of a pixel electrode layer, a first metal layer, a second metal layer, a semiconductor layer, and a transparent conductive layer according to some embodiments of the present disclosure.

Referring to FIGS. 1 to 3, FIG. 1 is a schematic cross-sectional view of a display device according to some embodiments of the present disclosure, FIG. 2 is a schematic plan view of a transparent conductive layer according to some embodiments of the present disclosure, and FIG. 3 is a schematic plan view of a pixel electrode layer, a first metal layer, a second metal layer, a semiconductor layer, and a transparent conductive layer according to some embodiments of the present disclosure.

As shown in FIG. 1, the display device 300 includes a display panel 100 and a backlight module 200 located on a back side of a light-emitting side of the display panel 100.

The display panel 100 includes an array substrate 10, an opposing substrate 20, and a liquid crystal layer 30. The array substrate 10 is disposed opposite to the opposing substrate 20. A liquid crystal layer 30 is disposed between the array substrate 10 and the opposing substrate 20 and includes a plurality of liquid crystal molecules 301.

The array substrate 10 includes a first substrate 101, a first metal layer 102, a semiconductor layer 103, a second metal layer 104, a transparent conductive layer 105, and a pixel electrode layer 106. The transparent conductive layer 105 is provided insulated from the pixel electrode layer 106. As shown in FIG. 2, the array substrate 10 includes an array region 10a and a peripheral region 10b located at a periphery of the array region 10a. The array area 10a corresponds to a display area of the display panel 100. The peripheral area 10b corresponds to a non-display area of the display panel 100. The opposing substrate 20 includes a second substrate 201 and a common electrode layer 202. The common electrode layer 202 is disposed on a surface of the second substrate 201 adjacent to the array substrate 10.

The first substrate 101 is disposed opposite to the second substrate 201. The first substrate 101 and the second substrate 201 are glass substrates, but are not limited thereto.

As shown in FIGS. 1 and 3, the first metal layer 102 is disposed on a surface of the first substrate 101 adjacent to the second substrate 201. The first metal layer 102 includes a gate 1021 and a scan line 1022. The gate 1021 is connected to a scan line 1022, which extends in a second direction y.

The semiconductor layer 103 is located on a side of the first metal layer 102 away from the first substrate 101. The semiconductor layer 103 includes an active layer 1031 that overlaps with the gate 1021. A first insulating layer 1071 is provided between the semiconductor layer 103 and the first metal layer 102. It will be appreciated that the semiconductor layer 103 may also be disposed between the first metal layer 102 and the first substrate 101.

As shown in FIGS. 1 and 3, the second metal layer 104 is located on a side of the semiconductor layer 103 away from the first substrate 101. A second insulating layer 1072 is provided between the second metal layer 104 and the semiconductor layer 103. The second metal layer 104 includes a source 1041 and a drain 1042 connected to the active layer 1031. The second metal layer 104 also includes a plurality of data lines 1043. The plurality of data lines 1043 extend in a first direction x and are arranged at intervals in the second direction y. The first direction x intersects the second direction y.

Specifically, the first direction x is perpendicular to the second direction y, but is not limited thereto. The included angle between the first direction x and the second direction y may also be an obtuse angle or an acute angle.

It should be noted that the source 1041, the drain 1042, the active layer 1031, and the gate 1021 constitute a thin-film transistor T. The source 1041 of the thin-film transistor T is connected to a data line 1043.

As shown in FIGS. 1, 2, and 3, the pixel electrode layer 106 is also disposed on the first substrate 101. The pixel electrode layer 106 includes a plurality of pixel electrodes 1061. The plurality of pixel electrodes 1061 are arranged in an array in the array region 10a in the first direction x and the second direction y. Each pixel electrode 1061 is connected to the drain 1042 of the thin-film transistor T. The material of the pixel electrode layer 106 includes at least one of indium tin oxide and indium zinc oxide.

As shown in FIG. 3, each pixel electrode 1061 includes a first trunk electrode 1062 extending in the first direction x, a second trunk electrode 1063 extending in the second direction y, a plurality of branch electrodes 1064, and a plurality of apertures 1065. The first trunk electrode 1062 is connected to a connection portion 1066. The connection portion 1066 is connected to the drain 1042 of the thin-film transistor T through a via hole, so that the first trunk electrode 1062 is connected to the drain 1042 of the thin-film transistor T.

One end of the second trunk electrode 1063 is connected between both ends of the first trunk electrode 1062, and the pixel electrode 1061 is in turn divided into two domain regions. The plurality of branch electrodes 1064 are located on both sides of the second trunk electrode 1063 in the first direction x and are connected to the first trunk electrode 1062 and/or the second trunk electrode 1063, respectively. An aperture 1065 is provided between two adjacent branch electrodes 1064 in one domain region. Therefore, the pixel electrode 1061 is a two-domain pixel electrode.

It should be noted that compared with four-domain pixel electrodes in some related art, the two-domain pixel electrode of the present disclosure has fewer trunk electrodes, which is more advantageous for improving the aperture ratio of the pixel electrode. As such, the light transmission of the display panel 100 is higher, thereby improving the display effect of the display device 300. In addition, the pixel electrode 1061 shown in FIG. 3 includes only one first trunk electrode 1062, which further reduces the number of trunk electrodes and is more advantageous for the improvement of the aperture ratio of the pixel electrode. The light transmittance of the display panel 100 is higher, and the display effect of the display device 300 is further improved.

In the case that two-domain pixel electrodes are used to increase the aperture ratio, the pixel electrodes 1061 are of asymmetric structures in the second direction y. Here, the reason for the asymmetry of a pixel electrode 1061 in the second direction y shown in FIG. 3 includes that the pixel electrode 1061 includes a first trunk electrode 1062 extending in the first direction x, and does not include an electrode symmetrical to the first trunk electrode 1062, and that the plurality of branch electrodes 1064 are not symmetrical in the second direction y either.

As shown in FIG. 1, the transparent conductive layer 105 is disposed on the first substrate 101. The transparent conductive layer 105 is located on a side, away from the first substrate 101, of a film layer on which the plurality of data lines 1043 are located. The transparent conductive layer 105 is located between the film layer on which the plurality of data lines 1043 are located and the pixel electrode layer 106. As such, at least a portion of the transparent conductive layer 105 overlaps with the data line 1043. At least the portion of the transparent conductive layer 105 replaces a shielding electrode in the related art that locates on a same layer as the pixel electrode 1061 does. At least the portion of the transparent conductive layer 105 functions as the shielding electrode, facilitating an increase in the layout area of the pixel electrode 1061, and improving the light transmittance of the display panel 100.

Specifically, as shown in FIG. 1, the transparent conductive layer 105 is located on a side of the second metal layer 104 away from the first substrate 101. The pixel electrode layer 106 is located on a side of the transparent conductive layer 105 away from the first substrate 101. A third insulating layer 1073 is provided between the transparent conductive layer 105 and the second metal layer 104. A fourth insulation layer 1074 is provided between the pixel electrode layer 106 and the transparent conductive layer 105.

In some embodiments, the first insulating layer 1071, the second insulating layer 1072, and the third insulating layer 1073 are all inorganic insulating layers. The fourth insulating layer 1074 is an organic insulating layer, and the organic insulating layer plays a flattening role. Materials of the inorganic insulating layers are selected from one or more of silicon oxide, silicon nitride, and silicon oxynitride. Materials of the organic insulating layer include one or more of polyimides and polyacrylates.

In some embodiments, as shown in FIG. 1, the array substrate 10 further includes a color resistance layer 108. The color resistance layer 108 is located between the second metal layer 104 where the plurality of data lines 1043 are located and the transparent conductive layer 105. Here, the color resistance layer 108 includes a plurality of color resistances of different colors, such as a red color resistance, a blue color resistance, and a green color resistance.

Specifically, a third insulating layer 1073 is provided between the color resistance layer 108 and the second metal layer 104. The transparent conductive layer 105 is located on a surface of the color resistance layer 108 away from the first substrate 101.

It should be noted that the color resistance layer 108 is provided between the transparent conductive layer 105 and the second metal layer 104 on which the plurality of data lines 1043 are located. As such, parasitic capacitances between the transparent conductive layer 105 and the plurality of data lines 1043 can be reduced, and the effect of the parasitic capacitances on data signals transmitted by the data lines 1043 can be reduced.

In some other embodiments, the transparent conductive layer 105 may also be located between the second metal layer 104 on which the plurality of data lines 1043 are located and the first substrate 101. The pixel electrode layer 106 is located on the side of the second metal layer 104 away from the first substrate 101, that is, the transparent conductive layer 105 is located below the second metal layer 104. In some other embodiments, the transparent conductive layer 105 may also be located between the first metal layer 102 on which a plurality of the scan lines 1022 are located and the first substrate 101, i.e., the transparent conductive layer 105 is located below the first metal layer 102.

The transparent conductive layer 105 includes a plurality of first transparent common electrode lines 1051 arranged at intervals in the second direction y and a plurality of second transparent common electrode lines 1052 arranged at intervals in the second direction y. The plurality of first transparent common electrode lines 1051 and the plurality of second transparent common electrode lines 1052 are both located in the array region 10a and extend in the first direction x. That is, the extension direction of the first transparent common electrode lines 1051 and the second transparent common electrode lines 1052 is the same as the extension direction of the data lines 1043.

A first transparent common electrode line 1051 and a second transparent common electrode line 1052 adjacent to each other in the second direction y are disconnected and arranged at intervals. Therefore, the first transparent common electrode lines 1051 and the second transparent common electrode lines 1052 are provided in a same layer to simplify the manufacturing process of both. In addition, both the first transparent common electrode lines 1051 and the second transparent common electrode lines 1052 are transparent, thereby improving the light transmittance of the display panel. Materials of the transparent conductive layer 105 includes at least one of indium tin oxide and indium zinc oxide.

In some other embodiments, the first transparent common electrode lines 1051 and the second transparent common electrode lines 1052 may be located at different transparent conductive layers, respectively. As such, flexibility in manufacturing the first transparent common electrode lines 1051 and the second transparent common electrode lines 1052 is improved.

It should be noted that the first transparent common electrode lines 1051 and the second transparent common electrode lines 1052 being provided in a same layer means that the first transparent common electrode lines 1051 and the second transparent common electrode lines 1052 are simultaneously prepared and obtained by patterning a same film layer. The first transparent common electrode lines 1051 and the second transparent common electrode lines 1052 being located on different transparent conductive layers respectively means that the first transparent common electrode lines 1051 and the second transparent common electrode lines 1052 are prepared and obtained by patterning two different film layers.

Specifically, the plurality of first transparent common electrode lines 1051 and the plurality of second transparent common electrode lines 1052 are alternately arranged one-to-one in the second direction y.

In some embodiments, in the case where the transparent conductive layer 105 is located between the second metal layer 104 on which the plurality of data lines 1043 are located and the pixel electrode layer 106, an orthographic projection of at least one of the first transparent common electrode line 1051 and the second transparent common electrode line 1052 adjacent to each other in the second direction y on the first substrate 101 overlaps with an orthographic projection of at least one of the data lines 1043 on the first substrate 101. Thus, at least one of the first transparent common electrode line 1051 and the second transparent common electrode line 1052 adjacent to each other in the second direction y may act as a shield for signals transmitted by the at least one of the data lines 1043. At least one of the first transparent common electrode line 1051 and the second transparent common electrode line 1052 replaces a shielding electrode in the related art that locates on a same layer as the pixel electrode 1061 does, thereby increasing the layout area of the pixel electrode 1061 and further improving the light transmittance of the display panel 100.

Specifically, as shown in FIG. 3, orthographic projections of a first transparent common electrode line 1051 and a second transparent common electrode line 1052 adjacent to each other in the second direction y on the first substrate 101 overlap with orthographic projections of two adjacent ones of the data lines 1043 on the first substrate 101, respectively. With this arrangement, a first transparent common electrode line 1051 and a second transparent common electrode line 1052 adjacent to each other in the second direction y both function as a shielding electrode, further increasing the layout area of the pixel electrode 1061, and further improving the light transmittance of the display panel 100.

In some other embodiments, an orthographic projection of either of the first transparent common electrode line 1051 and the second transparent common electrode line 1052 adjacent to each other on the first substrate 101 may overlap with an orthographic projection of one of the data lines 1043 on the first substrate 101.

In some embodiments, an orthographic projection of at least one of a first transparent common electrode line 1051 and a second transparent common electrode line 1052 adjacent to each other in a second direction y on the first substrate 101 overlaps with an orthographic projection of at least one of the pixel electrodes 1061 on the first substrate 101. By this design, except that a first transparent common electrode line 1051 and a second transparent common electrode line 1052 adjacent to each other in the second direction y may function as a shielding electrode, at least one of the first transparent common electrode line 1051 and the second transparent common electrode line 1052 adjacent to each other in the second direction y may form a storage capacitor with the at least one of the pixel electrodes 1061 to store display data.

In some embodiments, as shown in FIG. 3, an orthographic projection of one of a first transparent common electrode line 1051 and a second transparent common electrode line 1052 adjacent to each other in the second direction y on the first substrate 101 may overlap with an orthographic projection of at least one of the pixel electrodes 1061 on the first substrate 101, and an orthographic projection of another one of the first transparent common electrode line 1051 and the second transparent common electrode line 1052 adjacent to each other in the second direction y on the first substrate 101 may not overlap with an orthographic projection of the pixel electrode 1061 on the first substrate 101.

In some other embodiments, the orthographic projections of a first transparent common electrode line 1051 and a second transparent common electrode line 1052 adjacent to each other in the second direction y on the first substrate 101 may not overlap with orthographic projections of the pixel electrodes 1061 on the first substrate 101, but are provided adjacent to an orthographic projection of at least one of the pixel electrodes 1061 on the first substrate 101.

In some other embodiments, the orthographic projections of a first transparent common electrode line 1051 and a second transparent common electrode line 1052 adjacent to each other in the second direction y on the first substrate 101 may both overlap with an orthographic projection of at least one of the pixel electrodes 1061 on the first substrate 101.

In some embodiments, the orthographic projections of a first transparent common electrode line 1051 and a second transparent common electrode line 1052 adjacent to each other in the second direction y on the first substrate 101 both at least overlap with an orthographic projection of a trunk electrode of the pixel electrode 1061 on the first substrate 101.

For example, for a first transparent common electrode line 1051 and a second transparent common electrode line 1052 adjacent to each other, the orthographic projection of the first transparent common electrode line 1051 on the first substrate 101 overlaps with an orthographic projection of a first trunk electrode 1062 of at least one of the pixel electrodes 1061 on the first substrate 101, and the orthographic projection of the second transparent common electrode line 1052 on the first substrate 101 at least overlaps with an orthographic projection of a second trunk electrode 1063 of the pixel electrode 1061 on the first substrate 101. With this arrangement, when the storage capacitor is formed, the liquid crystal molecules above the trunk electrodes are better controlled to be tilted towards outside of the aperture region, thereby alleviating dark fringes around the trunk electrodes.

In some embodiments, in the case where both orthographic projections of a first transparent common electrode line 1051 and a second transparent common electrode line 1052 adjacent to each other in the second direction y on the first substrate 101 overlap with an orthographic projection of at least one of the pixel electrodes 1061 on the first substrate 101, areas of the orthographic projections of the first transparent common electrode line 1051 and the second transparent common electrode line 1052 adjacent to each other in the second direction y on the first substrate 101 differ from that of the orthographic projection of one pixel electrode 1061 on the first substrate 101. As such, capacitance values of the storage capacitors formed by the first transparent common electrode line 1051 and the second transparent common electrode line 1052 with a same pixel electrode 1061 are different so as to accommodate different capacitance requirements.

In some other embodiments, in the case where orthographic projections of a first transparent common electrode line 1051 and a second transparent common electrode line 1052 adjacent to each other in the second direction y on the first substrate 101 overlap with orthographic projections of the pixel electrodes 1061 on the first substrate 101, areas of the orthographic projections of the first transparent common electrode line 1051 and the second transparent common electrode line 1052 on the first substrate 101 may be same as that of an orthographic projection of a same pixel electrode 1061 on the first substrate 101. As such, capacitance values of the storage capacitors formed by the first transparent common electrode line 1051 and the second transparent common electrode line 1052 with the same pixel electrode 1061 are the same.

Orthographic projections of a second transparent common electrode line 1052 and a first transparent common electrode line 1051 adjacent to each other in the second direction y on the first substrate 101 are provided adjacent to an orthographic projection of at least one of the pixel electrodes 1061 on the first substrate 101. An orthographic projection of a gap between the first transparent common electrode line 1051 and the second transparent common electrode line 1052 adjacent to each other in the second direction y on the first substrate 101 overlaps with the orthographic projection of the at least one of the pixel electrodes 1061 on the first substrate 101. With this arrangement, during an alignment process of a plurality of liquid crystal molecules 301 of the liquid crystal layer 30, a first transparent common electrode line 1051 and a second transparent common electrode line 1052 adjacent to each other in the second direction y constitute a pair of transparent common electrode lines. A voltage applied to the pair of transparent common electrode lines cooperates with a voltage applied to a pixel electrode 1061 to align a plurality of liquid crystal molecules 301 controlled by the pixel electrode 1061. Voltages applied to multiple pairs of transparent common electrode lines cooperate with voltages applied to a number of the pixel electrodes 1061 to align a plurality of liquid crystal molecules 301 controlled by the number of the pixel electrodes 1061.

In addition, during operation of the display device 300, the plurality of first transparent common electrode lines 1051 and the plurality of second transparent common electrode lines 1052 are applied with same constant voltages, respectively. Thus, the plurality of first transparent common electrode lines 1051 and the plurality of second transparent common electrode lines 1052 have different roles during alignment of the liquid crystal molecules 301 and during display of the display device 300.

It should be noted that in the case where an orthographic projection of a gap between a second transparent common electrode line 1052 and a first transparent common electrode line 1051 adjacent to each other in the second direction y on the first substrate 101 overlaps with an orthographic projection of at least one of the pixel electrodes 1061 on the first substrate 101, at least three designs (A), (B) and (C) may be included. For design (A), orthographic projections of a second transparent common electrode line 1052 and a first transparent common electrode line 1051 adjacent to each other in the second direction y on the first substrate 101 may both overlap with an orthographic projection of at least one of the pixel electrodes 1061 on the first substrate 101. For design (B), an orthographic projection of one of the second transparent common electrode lines 1052 and the first transparent common electrode lines 1051 adjacent to each other in the second direction y on the first substrate 101 may overlap with an orthographic projection of at least one of the pixel electrodes 1061 on the first substrate 101, and an orthographic projection of another one of the second transparent common electrode lines 1052 and the first transparent common electrode lines 1051 adjacent to each other in the second direction y on the first substrate 101 may not overlap with the orthographic projection of the pixel electrode 1061 on the first substrate 101. For design (C), orthographic projections of a second transparent common electrode line 1052 and a first transparent common electrode line 1051 adjacent to each other in the second direction y on the first substrate 101 may be positioned on opposite sides of an orthographic projection of at least one of the pixel electrodes 1061 on the first substrate 101 in the second direction y, respectively.

FIG. 3 is only a schematic diagram illustrating an orthographic projection of a gap between a second transparent common electrode line 1052 and a first transparent common electrode line 1051 adjacent to each other in the second direction y on the first substrate 101 overlapping with an orthographic projection of at least one of the pixel electrodes 1061 on the first substrate 101. For the plurality of pixel electrodes 1061 of the array region 10a, orthographic projections of a second transparent common electrode line 1052 and a first transparent common electrode line 1051 adjacent to each other in the second direction y on the first substrate 101 overlap with orthographic projections of a number of pixel electrodes 1061 of a row of pixel electrodes 1061 disposed side-by-side in the first direction x on the first substrate 101.

In some embodiments, as shown in FIG. 3, the orthographic projection of the first transparent common electrode line 1051 on the first substrate 101 is provided adjacent to the orthographic projection of the first trunk electrode 1062 on the first substrate 101. The width of the first transparent common electrode line 1051 is larger than the width of the second transparent common electrode line 1052. The width of the first transparent common electrode line 1051 and the width of the second transparent common electrode line 1052 are both larger than the width of the data line 1043. With this arrangement, the first transparent common electrode line 1051 may cover the adjacent data line 1043 and the first trunk electrode 1062.

In some embodiments, an orthographic projection of a first transparent common electrode line 1051 on the first substrate 101 overlaps with orthographic projections of a first trunk electrode 1062 of a row of pixel electrodes 1061 disposed side-by-side in the first direction x and a data line 1043 on the first substrate 101. An orthographic projection of a second transparent common electrode line 1052 on the first substrate 101 overlaps with an orthographic projection of another data line 1043 on the first substrate 101. Moreover, an orthographic projection of a gap between a second transparent common electrode line 1052 and a first transparent common electrode line 1051 adjacent to each other in the second direction y on the first substrate 101 overlaps with orthographic projections of a plurality of branch electrodes 1064 of the pixel electrode 1061 on the first substrate 101. With this arrangement, the first transparent common electrode line 1051 and the second transparent common electrode line 1052 both function as a shielding electrode, and a storage capacitor is formed between the first transparent common electrode line 1051 and the pixel electrode 1061.

In the case where the pixel electrode 1061 is of an asymmetric structure in the second direction y, if the first transparent common electrode line 1051 and the second transparent common electrode line 1052 of the present disclosure are not provided, the light has a low transmittance in the vicinity of the first trunk electrode 1062 of the pixel electrode 1061, resulting in dark fringes in the vicinity of the first trunk electrode 1062 in the second direction y.

In the present disclosure, an electric field corresponding to a voltage difference between the adjacent pixel electrode 1061 and the first transparent common electrode line 1051 is independently controlled. An electric field corresponding to a voltage difference between the adjacent pixel electrode 1061 and the second transparent common electrode line 1052 is independently controlled. The pretilt angle(s) of the liquid crystal molecules 301 under an action of the electric field formed between the first transparent common electrode line 1051 and the pixel electrode 1061 and the pretilt angle(s) of the liquid crystal molecules 301 under an action of the electric field formed between the second transparent common electrode line 1052 and the pixel electrode 1061 may both be independently controlled. Providing conditions for the liquid crystal molecules 301 to tilt towards an area outside of the aperture region of the pixel electrode 1061 in the second direction y is advantageous for ameliorating the problem of dark fringes of the pixel electrode 1061 in the second direction y, which in turn improves the transmittance of the display panel 100 with respect to the backlight emitted by the backlight module 200, and improves the display effect of the display device 300. In particular, in the case where the orthographic projection of the first transparent common electrode line 1051 on the first substrate 101 overlaps with the orthographic projection of the first trunk electrode 1062 of the row of pixel electrodes 1061 disposed side-by-side in the first direction x on the first substrate 101, the voltage applied to the first transparent common electrode line 1051 is controlled so that the liquid crystal molecules 301 above the first trunk electrode 1062 may be tilted towards outside of the aperture, thereby ameliorating the problem that the light has a low transmittance in the vicinity of the first trunk electrode 1062 of the pixel electrode 1061 and dark fringes in turn occur in the second direction y.

It should be noted that in some related art, when an entire transparent conductive layer is used with a pixel electrode layer and a common electrode to align the liquid crystals, only one voltage can be applied to the entire transparent conductive layer, so that the localized dark fringes occurring in the display of the display panel cannot be improved. In addition, compared with the related art in which common electrode lines are metal lines etc., which will reduce the transmittance of the display panel, the present disclosure employs the first transparent common electrode lines 1051 and the second trunk common electrode line 1054 for the alignment of the liquid crystal molecules 301, which may also improve the transmittance of the display panel 100 with respect to the backlight emitted by the backlight module 200.

In addition, in the related art, the size of the pixel electrodes in the first direction x is larger, and correspondingly, the area of the dark fringes of the pixel electrodes in the second direction y is larger. In order to solve the problem that the area of the dark fringes of the pixel electrodes in the second direction y is larger, the present disclosure adds a first transparent common electrode line 1051 and a second transparent common electrode line 1051 adjacent to each other and arranged at intervals in the second direction y for each pixel electrode. An orthographic projection of a gap between a second transparent common electrode line 1052 and a first transparent common electrode line 1051 adjacent to each other in the second direction y on the first substrate 101 overlaps with an orthographic projection of at least one of the pixel electrodes 1061 on the first substrate 101, which distinctly ameliorates the problem of dark fringes of pixel electrodes in the second direction y, and in turn significantly improves the light transmittance of the display panel 100.

As can be seen from the above, a second transparent common electrode line 1052 and a first transparent common electrode line 1051 adjacent to each other in the second direction y may be used not only as a shielding electrode of the data line 1043, but also as an electrode plate of the storage capacitor, and may as well be used to ameliorate the problem of dark fringes in the vicinity of the trunk electrode of the pixel electrode extending in the first direction x. With this arrangement, the shielding electrode and the electrode plate in the related art may be omitted, and the light transmittance of the display panel may be significantly improved.

It will be appreciated that when the pixel electrode 1061 includes a lateral trunk electrode extending in the second direction y and located at the outermost side of the pixel electrode 1061, the orthographic projection of the lateral trunk electrode on the first substrate 101 may also overlap with the orthographic projection of the third common electrode line (not shown) on the first substrate 101. As such, the problem of dark fringes in the vicinity of the lateral trunk electrode is ameliorated.

As shown in FIG. 2, the array substrate 10 further includes a first trunk common electrode line 1053 extending in the second direction y and a second trunk common electrode line 1054 extending in the second direction y. The first trunk common electrode line 1053 is located in the peripheral region 10b and is connected to the plurality of first transparent common electrode lines 1051. The second trunk common electrode line 1054 is located in the peripheral region 10b and is disposed disconnected from the first trunk common electrode line 1053 and connected to the plurality of second transparent common electrode lines 1052. The first trunk common electrode line 1053 and the second trunk common electrode line 1054 are located on opposite sides of the array region 10a in the first direction x. As such, the first trunk common electrode line 1053 and the second trunk common electrode line 1054 are connected to the first transparent common electrode line 1051 and the second transparent common electrode line 1052, respectively, and the risk of the first trunk common electrode line 1053 and the second trunk common electrode line 1054 being short-circuited is reduced.

Specifically, the transparent conductive layer 105 further includes a first trunk common electrode line 1053 and a second trunk common electrode line 1054. With this arrangement, the manufacturing process of the array substrate is simplified and the manufacturing process of the display panel is simplified.

It will be appreciated that at least a portion of the first trunk common electrode line 1053 and at least a portion of the second trunk common electrode line 1054 may also be disposed in the array region 10a. With this arrangement, it is advantageous for the display panel to realize the structure of a narrow bezel.

Figure 4:
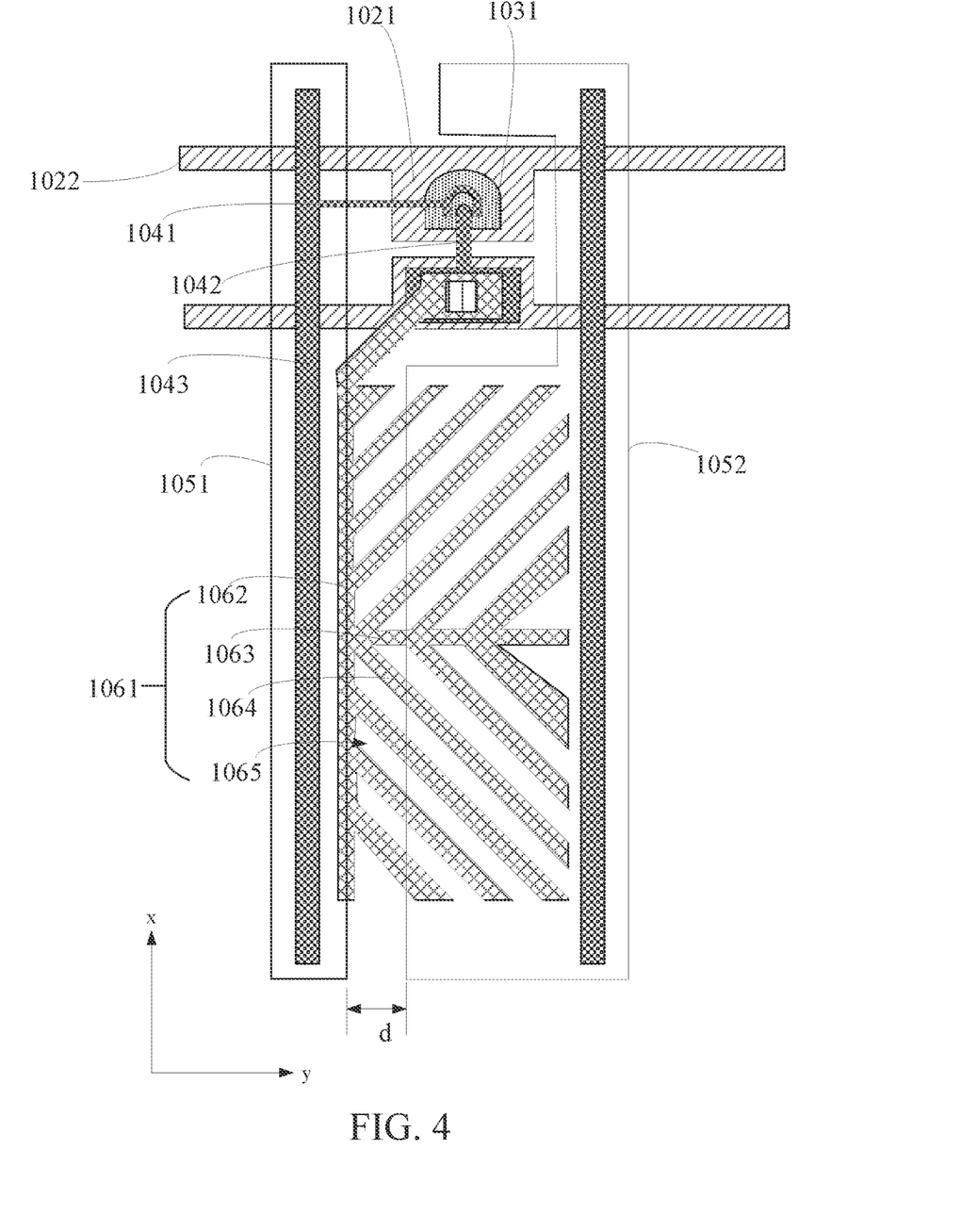
FIG. 4 is a schematic plan view of a pixel electrode layer, a first metal layer, a second metal layer, a semiconductor layer, and a transparent conductive layer according to some other embodiments of the present disclosure.

In the present disclosure, different alignment voltages may be applied to the first trunk common electrode line 1053 and the second trunk common electrode line 1054, respectively, during alignment of the liquid crystal molecules 301. During operation of the display device 300, same constant voltages are applied to the first trunk common electrode line 1053 and the second trunk common electrode line 1054, respectively, so as to apply the same constant voltage to the plurality of first transparent common electrode lines 1051 and the plurality of second transparent common electrode lines 1052, respectively. Referring to FIG. 4, there is shown a schematic plan view of a pixel electrode layer, a first metal layer, a second metal layer, a semiconductor layer, and a transparent conductive layer in some other embodiments of the present disclosure. In some other embodiments, the orthographic projection of at least one of the first transparent common electrode line 1051 and the second transparent common electrode line 1052 adjacent to each other in the second direction y on the first substrate 101 overlaps with the orthographic projection of the branch electrode 1064 on the first substrate 101. With this arrangement, the overlapping area of at least one of the first transparent common electrode line 1051 and the second transparent common electrode line 1052 with the pixel electrode 1061 is increased, the capacitance value of the storage capacitor is increased, and the display problem caused by electric leakage of the storage capacitor is ameliorated.

In some embodiments, an area where an orthographic projection of a first transparent common electrode line 1051 on the first substrate 101 overlaps with an orthographic projection of the first trunk electrode 1062 on the first substrate 101 is larger than an area where an orthographic projection of a second transparent common electrode line 1052 on the first substrate 101 overlaps with an orthographic projection of the first trunk electrode 1062 on the first substrate 101. With this arrangement, the problem of dark fringes in the vicinity of the first trunk electrode 1062 is ameliorated through the first transparent common electrode line 1051.

In some embodiments, the area of a second transparent common electrode line 1052 is greater than the area of a first transparent common electrode line 1051. With this arrangement, it is advantageous that the capacitance value of the storage capacitor formed by a second transparent common electrode line 1052 and a pixel electrode is greater than the capacitance value of the storage capacitor formed by a first transparent common electrode line 1051 and a pixel electrode.

In some embodiments, the area where the orthographic projection of a first transparent common electrode line 1051 on the first substrate 101 overlaps with the orthographic projection of a plurality of branch electrodes 1064 of a pixel electrode 1061 on the first substrate 101 is smaller than the area where the orthographic projection of a second transparent common electrode line 1052 on the first substrate 101 overlaps with the orthographic projection of a plurality of branch electrodes 1064 of a pixel electrode 1061 on the first substrate 101. With this arrangement, the capacitance value of the storage capacitor formed between the second transparent common electrode line 1052 and the pixel electrode 1061 is larger, thereby ameliorating the display problem caused by electric leakage of the storage capacitor.

In a specific embodiment, the orthographic projection of a first transparent common electrode line 1051 on the first substrate 101 overlaps with the orthographic projections of a first trunk electrode 1062 and a data line 1043 on the first substrate 101 without overlapping with the orthographic projection of the branch electrode 1064 on the first substrate 101. The orthographic projection of the second transparent common electrode line 1052 on the first substrate 101 overlaps with the orthographic projections of the plurality of branch electrodes 1064, another data line 1043, and the second trunk electrode 1063 on the first substrate 101 without overlapping with the first trunk electrode 1062. With this arrangement, the first transparent common electrode line 1051 and the second transparent common electrode line 1052 both function as a shielding electrode. The first transparent common electrode line 1051 can ameliorate the problem of dark fringes around the first trunk electrode 1062. The storage capacitor formed between the second transparent common electrode line 1052 and the pixel electrode 1061 is larger, and the problem caused by electric leakage of the storage capacitor can be ameliorated.

In some other embodiments, the orthographic projection of a first transparent common electrode line 1051 on the first substrate 101 may also overlap with the orthographic projections of a first trunk electrode 1062, a plurality of branch electrodes 1064, and a data line 1043 on the first substrate 101.

In some other embodiments, the orthographic projection of the gap between the first transparent common electrode line 1051 and the second transparent common electrode line 1052 adjacent to each other in the second direction y on the first substrate 101 overlaps with the orthographic projection of the branch electrode 1064 on the first substrate 101. The area where the first transparent common electrode line 1051 overlaps with the second transparent common electrode line 1052 and the pixel electrode 1061 is increased.

In some other embodiments, the minimum pitch d in the second direction y between the first transparent common electrode line 1051 and the second transparent common electrode line 1052 adjacent to each other in the second direction y is greater than or equal to 2.5 microns and less than or equal to 3.5 microns. With this arrangement, the area in which the first transparent common electrode line 1051 overlaps with the second transparent common electrode line 1052 and the pixel electrode 1061 is increased, meanwhile the process accuracy of forming the first transparent common electrode line 1051 and the second transparent common electrode line 1052 is accommodated, thereby simplifying the manufacturing difficulty of the display panel 100. The minimum pitch d in the second direction y between the first transparent common electrode line 1051 and the second transparent common electrode line 1052 adjacent to each other in the second direction y being too small causes the process of manufacturing the first transparent common electrode line 1051 and the second transparent common electrode line 1052 to be too difficult. The minimum pitch d in the second direction y between the first transparent common electrode line 1051 and the second transparent common electrode line 1052 adjacent to each other in the second direction y being too large causes the utilization of the transparent conductive layer 105 to be reduced.

In some other embodiments, the orthographic projections of a first transparent common electrode line 1051 and a second transparent common electrode line 1052 adjacent to each other in the second direction y on the first substrate 101 do not overlap with the orthographic projections of the gate 1021 and the active layer 1031 of the thin-film transistor T on the first substrate 101. With this arrangement, the influences of the first transparent common electrode line 1051 and the second transparent common electrode line 1052 on the gate 1021 and the active layer 1031 are reduced.

Figure 5:
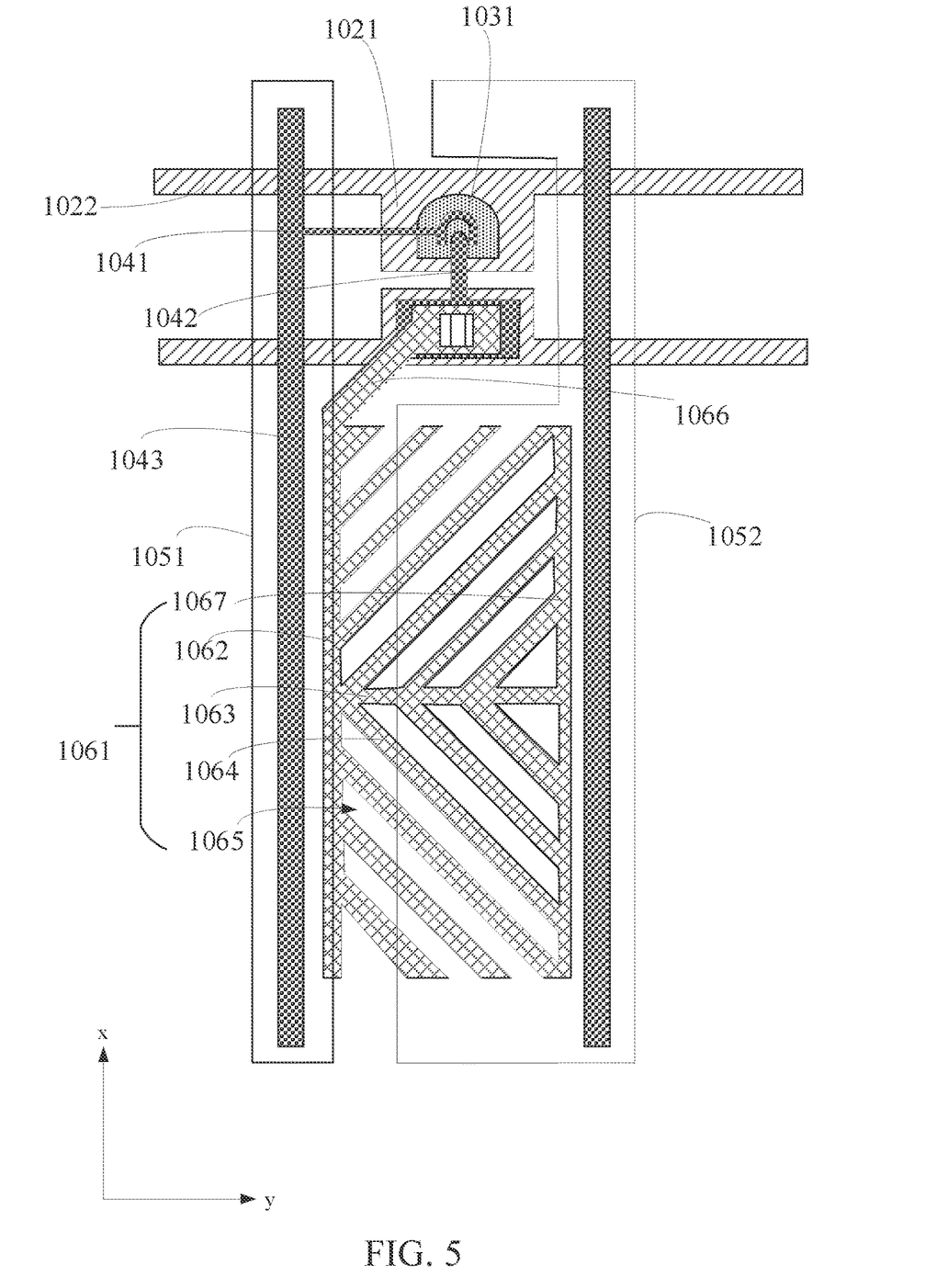
FIG. 5 is a schematic plan view of a pixel electrode layer, a first metal layer, a second metal layer, a semiconductor layer, and a transparent conductive layer according to still some other embodiments of the present disclosure.

Referring to FIG. 5, there is shown a schematic plan view of a pixel electrode layer, a first metal layer, a second metal layer, a semiconductor layer, and a transparent conductive layer according to still some other embodiments of the present disclosure. The pixel electrode 1061 shown in FIG. 5 is substantially similar to the pixel electrodes 1061 shown in FIGS. 3 and 4, and the similarities are not repeated in detail, the differences lie in that the pixel electrode 1061 further includes a third trunk electrode 1067 extending in the first direction x. The third trunk electrode 1067 is arranged parallel to and opposite to the first trunk electrode 1062, another end of the second trunk electrode 1063 is connected between the two ends of the third trunk electrode 1067, a portion of the branch electrodes 1064 is connected to the third trunk electrode 1067, and the second transparent common electrode line 1052 is overlapped with the third trunk electrode 1067.

In some embodiments of the present disclosure, in the case where the pixel electrode 1061 includes both the third trunk electrode 1067 and the first trunk electrode 1062, the orthographic projection of the first transparent common electrode line 1051 on the first substrate 101 overlaps with the orthographic projections of the first trunk electrode 1062 and a data line 1043 on the first substrate 101. Moreover, the orthographic projection of the second transparent common electrode line 1052 on the first substrate 101 overlaps with the orthographic projections of the third trunk electrode 1067, another data line 1043, and the plurality of branch electrodes 1064 on the first substrate 101.

In some other embodiments, the width of the third trunk electrode 1067 is the same as the width of the first trunk electrode 1062.

Voltages are applied to the first transparent common electrode line 1051 and the second transparent common electrode line 1052, respectively. The pretilt angle(s) of the liquid crystal molecules 301 under the action of the electric field formed by the voltage difference between the pixel electrode 1061 and the first transparent common electrode line 1051 and the pretilt angle(s) of the liquid crystal molecules 301 under the action of the electric field formed by the voltage difference between the pixel electrode 1061 and the second transparent common electrode line 1052 can be independently controlled. The liquid crystal molecules 301 in the liquid crystal layer 30 are tilted towards outside of the aperture region in the second direction y, thereby ameliorating the problem of the dark fringes in the vicinity of the third trunk electrode 1067 and the first trunk electrode 1062 of the pixel electrode 1061 in the second direction y, which in turn improves the light transmittance of the display panel 100 and improves the display effect of the display device 300.

Figure 6:
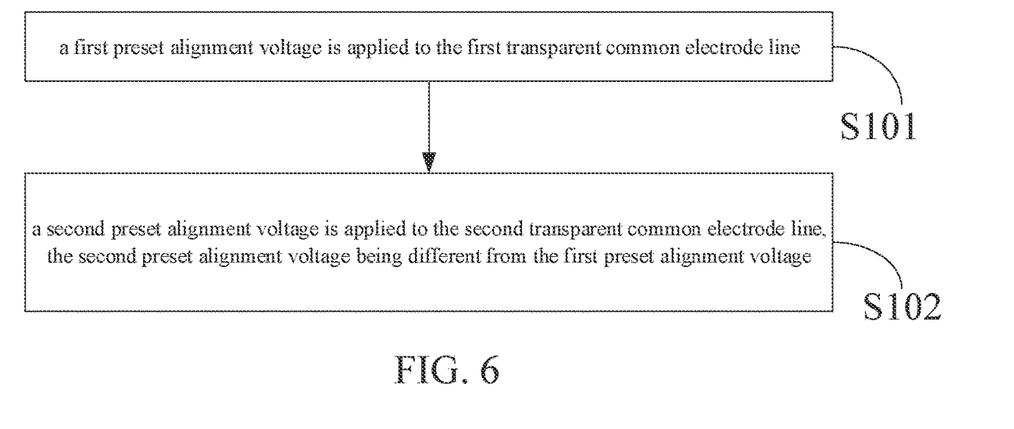
FIG. 6 is a schematic flow diagram of an alignment method of liquid crystal molecules of a display panel of a display device according to some embodiments of the present disclosure.

Referring to FIG. 6, there is shown a schematic flow diagram of an alignment method of liquid crystal molecules 301 of a display panel of a display device according to some embodiments of the present disclosure. The display panel 100 may be a display panel of the display device 300 of any of the above embodiments, and will not be described herein again. The alignment method of the liquid crystal molecules 301 of the display panel 100 includes steps S101 and S102.

At step S101, a first preset alignment voltage is applied to the first transparent common electrode line 1051.

At step S102, a second preset alignment voltage is applied to the second transparent common electrode line 1052, and the second preset alignment voltage is different from the first preset alignment voltage.

It should be noted that the applying of the first predetermined alignment voltage to the first transparent common electrode line 1051 and the applying of the second predetermined alignment voltage to the second transparent common electrode line 1052 may be performed simultaneously, but is not limited thereto. In addition, the above method further includes applying a preset alignment common voltage to the common electrode layer 202 without applying a voltage to the plurality of pixel electrodes 1061.

During the liquid crystal alignment process, the absolute value of the difference between the voltage of the pixel electrode 1061 (0V) and the first preset alignment voltage is different from the absolute value of the difference between the voltage of the pixel electrode 1061 and the second preset alignment voltage. With this arrangement, the intensity of the electric field corresponding to the voltage difference between the first transparent common electrode line 1051 and the pixel electrode 1061 is different from the intensity of the electric field corresponding to the voltage difference between the second transparent common electrode line 1052 and the pixel electrode 1061. The pretilt angle(s) of the liquid crystal molecules 301 under the action of the electric field corresponding to the voltage difference between the first transparent common electrode line 1051 and the pixel electrode 1061 is different from the pretilt(s) angle of the liquid crystal molecules 301 under the action of the electric field corresponding to the voltage difference between the second transparent common electrode line 1052 and the pixel electrode 1061.

For example, during liquid crystal alignment, no voltage is applied to the pixel electrode 1061. The alignment common voltage applied to the common electrode layer 202 is 15V. The first preset alignment voltage applied to the first transparent common electrode line 1051 is −8V. The second preset alignment voltage applied to the second transparent common electrode line 1052 is −3V.

Therefore, the absolute value of the difference between the voltage applied to the pixel electrode 1061 and the first preset alignment voltage applied to the first transparent common electrode line 1051 is 8V. The absolute value of the difference between the voltage applied to the pixel electrode 1061 and the voltage applied to the second transparent common electrode line 1052 is 3 V. The intensity of the electric field formed between the pixel electrode 1061 and the first transparent common electrode line 1051 is stronger than the intensity of the electric field formed between the pixel electrode 1061 and the second transparent common electrode line 1052. The pretilt angle a of the liquid crystal molecules 301 (for example, the liquid crystal molecules 301A at the edge of the branch electrode in FIG. 1) overlapped with the first transparent common electrode line 1051 is larger than the pretilt angle b of the liquid crystal molecules 301 (for example, the liquid crystal molecules 301B at the edge of the branch electrode in FIG. 1) overlapped with the second transparent common electrode line 1052. In the case where the first transparent common electrode line 1051 overlaps with the first trunk electrode 1062, the liquid crystal molecules 301 overlapped with the first transparent common electrode line 1051 are more easily to be tilted towards the outside of the aperture region. That is, the liquid crystal molecules 301 on the first trunk electrode 1062 are more easily to be tilted towards a side away from the branch electrode 1064 (connected to the first trunk electrode 1062), which in turn controls the dark fringes in the vicinity of the first trunk electrode 1062 in the second direction y to be within the non-aperture region, thereby improving the transmittance of the display panel 100 with respect to the backlight and improving the display effect of the display device 300.

It should be noted that the pretilt angle takes the thickness direction of the display panel as the reference direction, and the larger the angle deviated from the thickness direction, the larger the pretilt angle. For example, the angle at which the liquid crystal molecules 301A deviate from the reference direction is larger than the angle at which the liquid crystal molecules 301B deviate from the reference direction. In addition, the display panel 100 further includes two alignment layers (not shown), with one alignment layer being located on the array substrate 10 and disposed on the side of the pixel electrode layer 106 away from the first substrate 101, and the other alignment layer being located on the opposing substrate 20 and disposed on the side of the common electrode layer 202 away from the second substrate 201. The pretilt angle(s) of the plurality of liquid crystal molecules 301 after alignment is fixed by two alignment layers.

It should also be noted that in the case where the pixel electrode 1061 assumes the pixel electrode as shown in FIG. 5, the voltages applied to the first transparent common electrode line 1051 and the second transparent common electrode line 1052 can be independently controlled. The liquid crystal molecules 301 adjacent to the first trunk electrode 1062 and the liquid crystal molecules 301 adjacent to the third trunk electrode 1067 are both tilted towards outside of the aperture region (a side away from the pixel electrode), which in turn controls the dark fringes of the pixel electrode 1061 on both sides in the second direction y to be within the non-aperture region, thereby improving the transmittance of the display panel 100 with respect to the backlight and improving the display effect of the display device 300.

In some other embodiments, the second preset alignment voltage may also be the same as the first preset alignment voltage.

The above description of the embodiments is merely intended to assist in understanding the technical solution of the present disclosure and the core concepts thereof. It will be appreciated by those of ordinary skill in the art that modifications may still be made to the technical solutions described in the foregoing embodiments, or equivalents may be made to some of the technical features therein. These modifications or substitutions do not depart the essence of the corresponding technical solutions from the scope of the technical solutions of the embodiments of the present disclosure.

What is claimed is:

1. An array substrate comprising:
  a first substrate;
  a plurality of data lines extending in a first direction and arranged at intervals in a second direction, disposed on the first substrate, the first direction intersecting the second direction;
  a pixel electrode layer disposed on the first substrate and including a plurality of pixel electrodes, wherein the pixel electrode includes a first trunk electrode extending in the first direction;
  first transparent common electrode lines extending in the first direction, disposed on the first substrate and insulated from the pixel electrode layer; and
  second transparent common electrode lines extending in the first direction, disposed on the first substrate and insulated from the pixel electrode layer, and disposed disconnected from the first transparent common electrode lines;
  wherein an orthographic projection of a gap between one of the first transparent common electrode lines and one of the second transparent common electrode lines adjacent to each other in the second direction on the first substrate overlaps with an orthographic projection of at least one of the pixel electrodes on the first substrate,
  wherein an area where an orthographic projection of a first transparent common electrode line on the first substrate overlaps with an orthographic projection of the first trunk electrode on the first substrate is larger than an area where an orthographic projection of a second transparent common electrode line on the first substrate overlaps with an orthographic projection of the first trunk electrode on the first substrate,
  wherein an area of the second transparent common electrode line is greater than an area of the first transparent common electrode line.

2. The array substrate of claim 1, wherein a plurality of the first transparent common electrode lines and a plurality of the second transparent common electrode lines are alternately arranged in the second direction.

3. The array substrate of claim 2, wherein the array substrate further comprising:
  a first trunk common electrode line extending in the second direction, connected to a plurality of the first transparent common electrode lines; and
  a second trunk common electrode line extending in the second direction, disposed disconnected from the first trunk common electrode line and connected to a plurality of the second transparent common electrode lines.

4. The array substrate of claim 1, wherein an orthographic projection of at least one of a first transparent common electrode line of the first transparent common electrode lines and a second transparent common electrode line of the second transparent common electrode lines adjacent to each other in the second direction on the first substrate overlaps with an orthographic projection of at least one of the pixel electrodes on the first substrate.

5. The array substrate of claim 1, wherein the pixel electrode includes a plurality of branch electrodes arranged at intervals and a plurality of apertures arranged at intervals, one of the apertures being disposed between two adjacent ones of the branch electrodes;
  an orthographic projection of at least one of a first transparent common electrode line of the first transparent common electrode lines and a second transparent common electrode line of the second transparent common electrode lines adjacent to each other in the second direction on the first substrate overlaps with an orthographic projection of the branch electrode of the at least one of the pixel electrode on the first substrate.

6. The array substrate of claim 4, wherein the pixel electrode includes a plurality of branch electrodes arranged at intervals and a plurality of apertures arranged at intervals, one of the apertures being disposed between two adjacent ones of the branch electrodes;
  an orthographic projection of at least one of a first transparent common electrode line of the first transparent common electrode lines and a second transparent common electrode line of the second transparent common electrode lines adjacent to each other in the second direction on the first substrate overlaps with an orthographic projection of the branch electrode of the at least one of the pixel electrode on the first substrate.

7. The array substrate of claim 1, wherein the array substrate comprising a transparent conductive layer including the first transparent common electrode lines and the second transparent common electrode lines;
  wherein the pixel electrode layer is located on a side, away from the first substrate, of a film layer on which the plurality of data lines are located, and the transparent conductive layer is located between the film layer on which the plurality of data lines are located and the pixel electrode layer.

8. The array substrate of claim 4, wherein the array substrate comprising a transparent conductive layer including the first transparent common electrode lines and the second transparent common electrode lines;
  wherein the pixel electrode layer is located on a side, away from the first substrate, of a film layer on which the plurality of data lines are located, and the transparent conductive layer is located between the film layer on which the plurality of data lines are located and the pixel electrode layer.

9. The array substrate of claim 7, wherein an orthographic projection of at least one of a first transparent common electrode line of the first transparent common electrode lines and a second transparent common electrode line of the second transparent common electrode lines adjacent to each other in the second direction on the first substrate overlaps with an orthographic projection of at least one of the data lines on the first substrate.

10. The array substrate of claim 8, wherein an orthographic projection of at least one of a first transparent common electrode line of the first transparent common electrode lines and a second transparent common electrode line of the second transparent common electrode lines adjacent to each other in the second direction on the first substrate overlaps with an orthographic projection of at least one of the data lines on the first substrate.

11. The array substrate of claim 7, wherein the array substrate further comprising:
a color resistance layer located between a film layer on which the plurality of data lines are located and the transparent conductive layer.

12. The array substrate of claim 8, wherein the array substrate further comprising:
a color resistance layer located between a film layer on which the plurality of data lines are located and the transparent conductive layer.

13. The array substrate of claim 1, wherein the pixel electrode is of an asymmetric structure in the second direction.

14. The array substrate of claim 1, wherein the pixel electrode includes:
a second trunk electrode extending in the second direction, one end of the second trunk electrode being connected between both ends of the first trunk electrode;
a plurality of branch electrodes located on both sides of the second trunk electrode in the first direction and respectively connected to the first trunk electrode and/or the second trunk electrode;
wherein an orthographic projection of one of the first transparent common electrode lines on the first substrate overlaps with orthographic projections of the first trunk electrode and one of the data lines on the first substrate, and an orthographic projection of one of the second transparent common electrode lines on the first substrate overlaps with orthographic projections of a portion of the branch electrodes and another one of the data lines on the first substrate.

15. The array substrate of claim 13, wherein the pixel electrode includes:
a second trunk electrode extending in the second direction, one end of the second trunk electrode being connected between both ends of the first trunk electrode;
a plurality of branch electrodes located on both sides of the second trunk electrode in the first direction and respectively connected to the first trunk electrode and/or the second trunk electrode;
wherein an orthographic projection of one of the first transparent common electrode lines on the first substrate overlaps with orthographic projections of the first trunk electrode and one of the data lines on the first substrate, and an orthographic projection of one of the second transparent common electrode lines on the first substrate overlaps with orthographic projections of a portion of the branch electrodes and another one of the data lines on the first substrate.

16. A display panel comprising an array substrate, an opposing substrate, and a liquid crystal layer, the opposing substrate is disposed opposite to the array substrate, and the liquid crystal layer is disposed between the array substrate and the opposing substrate;
the array substrate includes:
a first substrate;
a plurality of data lines extending in a first direction and arranged at intervals in a second direction, disposed on the first substrate, the first direction intersecting the second direction;
a pixel electrode layer disposed on the first substrate and including a plurality of pixel electrodes, wherein the pixel electrode includes a first trunk electrode extending in the first direction;
first transparent common electrode lines extending in the first direction, disposed on the first substrate and insulated from the pixel electrode layer; and
second transparent common electrode lines extending in the first direction, disposed on the first substrate and insulated from the pixel electrode layer, and disposed disconnected from the first transparent common electrode lines;
wherein an orthographic projection of a gap between one of the first transparent common electrode lines and one of the second transparent common electrode lines adjacent to each other in the second direction on the first substrate overlaps with an orthographic projection of at least one of the pixel electrodes on the first substrate;
wherein orthographic projections of one of the first transparent common electrode lines and one of the second transparent common electrode lines adjacent to each other in the second direction on the first substrate do not overlap with an orthographic projection of a gate of a thin film transistor on the first substrate,
wherein an area of the second transparent common electrode line is greater than an area of the first transparent common electrode line.

17. The display panel of claim 16, wherein a plurality of the first transparent common electrode lines and a plurality of the second transparent common electrode lines are alternately arranged in the second direction.

18. The display panel of claim 17, wherein the array substrate further comprising:
a first trunk common electrode line extending in the second direction, connected to a plurality of the first transparent common electrode lines; and
a second trunk common electrode line extending in the second direction, disposed disconnected from the first trunk common electrode line and connected to a plurality of the second transparent common electrode lines.

19. The display panel of claim 16, wherein an orthographic projection of at least one of a first transparent common electrode line of the first transparent common electrode lines and a second transparent common electrode line of the second transparent common electrode lines adjacent to each other in the second direction on the first substrate overlaps with an orthographic projection of at least one of the pixel electrodes on the first substrate.

20. An alignment method of liquid crystal molecules, applied to a display panel, wherein the display panel comprises an array substrate and an opposing substrate disposed opposite each other, and a liquid crystal layer disposed between the array substrate and the opposing substrate and including a plurality of liquid crystal molecules; the array substrate includes a first substrate and a pixel electrode layer disposed on the first substrate, first transparent common electrode lines extending in a first direction, second transparent common electrode lines extending in the first direction, and a plurality of data lines extending in a first direction and arranged at intervals in a second direction; the pixel electrode layer including a plurality of pixel electrodes, wherein the pixel electrode includes a first trunk electrode extending in the first direction, the first transparent common electrode lines and the second transparent common electrode lines disposed disconnected from each other and insulated from the pixel electrode layer; an orthographic projection of a gap between one of the first transparent common electrode lines and one of the second transparent common electrode lines adjacent to each other in the second direction on the first substrate overlaps with an orthographic projection of at least one of the pixel electrodes on the first substrate, wherein an area where an orthographic projection of a first transparent common electrode line on the first substrate overlaps with an orthographic projection of the first trunk electrode on the first substrate is larger than an area where an orthographic projection of a second transparent common electrode line on the first substrate overlaps with an orthographic projection of the first trunk electrode on the first substrate, wherein an area of the second transparent common electrode line is greater than an area of the first transparent common electrode line, the first direction intersecting the second direction;

the method comprising:
      applying a first preset alignment voltage to the first transparent common electrode lines;
      applying a second preset alignment voltage to the second transparent common electrode lines, the second preset alignment voltage being different from the first preset alignment voltage.

\* \* \* \* \*